United States Patent
Higashi et al.

(10) Patent No.: US 6,903,917 B2
(45) Date of Patent: Jun. 7, 2005

(54) SUBSTRATE-EMBEDDED CAPACITOR, PRODUCTION METHOD THEREOF, AND CIRCUIT BOARD

(75) Inventors: Mitsutoshi Higashi, Nagano (JP); Hideaki Sakaguchi, Nagano (JP); Hiroko Koike, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 10/453,311

(22) Filed: Jun. 3, 2003

(65) Prior Publication Data

US 2003/0223177 A1 Dec. 4, 2003

(30) Foreign Application Priority Data

Jun. 3, 2002 (JP) ........................................ 2002-161842

(51) Int. Cl.[7] ............................ H01G 4/228; H01G 4/06
(52) U.S. Cl. ...................... 361/306.1; 361/311; 361/763
(58) Field of Search ......................... 361/306.1–306.3, 361/307, 311, 301.4, 760–761, 763, 766; 174/260, 262

(56) References Cited

U.S. PATENT DOCUMENTS

| | | | | |
|---|---|---|---|---|
| 3,882,059 A | * | 5/1975 | Elderbaum | 29/25.42 |
| 5,155,655 A | * | 10/1992 | Howard et al. | 361/303 |
| 6,023,407 A | * | 2/2000 | Farooq et al. | 361/303 |
| 6,388,207 B1 | * | 5/2002 | Figueroa et al. | 174/262 |
| 6,678,144 B2 | * | 1/2004 | Higashi et al. | 361/306.3 |
| 6,724,611 B1 | * | 4/2004 | Mosley | 361/306.3 |

FOREIGN PATENT DOCUMENTS

| | | | | |
|---|---|---|---|---|
| EP | 1231628 | * | 2/2001 | H01L/21/02 |
| JP | 11-40774 | * | 2/1999 | H01L/27/108 |
| JP | 2002-121075 | * | 4/2004 | C04B/35/622 |

* cited by examiner

*Primary Examiner*—Eric W. Thomas
(74) *Attorney, Agent, or Firm*—Ladas & Parry LLP (57) ABSTRACT

A capacitor is embedded in a substrate having a small thickness where only a small space for short connection lines is required. The substrate-embedded capacitor includes a substrate having an opening, a first conductive layer on the substrate, a dielectric layer on the first conductive layer, a second conductive layer on the dielectric layer, and an insulating layer formed on the second conductive layer and having an opening. In the substrate-embedded capacitor, the first conductive layer and the second conductive layer are exposed through the openings in the substrate and the insulating layer, respectively.

13 Claims, 7 Drawing Sheets

SUBSTRATE-EMBEDDED CAPACITOR, PRODUCTION METHOD THEREOF, AND CIRCUIT BOARD

BACKGROUND OF THE INVENTION

1. Field of the Invention

The present invention relates to a capacitor embedded in a substrate, a method for producing the same, and a circuit board including the capacitor.

2. Description of the Related Art

Along with the rising density of semiconductor devices, a circuit substrate with capacitors embedded has been proposed to meet the needs of reducing the size and thickness of semiconductor devices.

Figure 1:
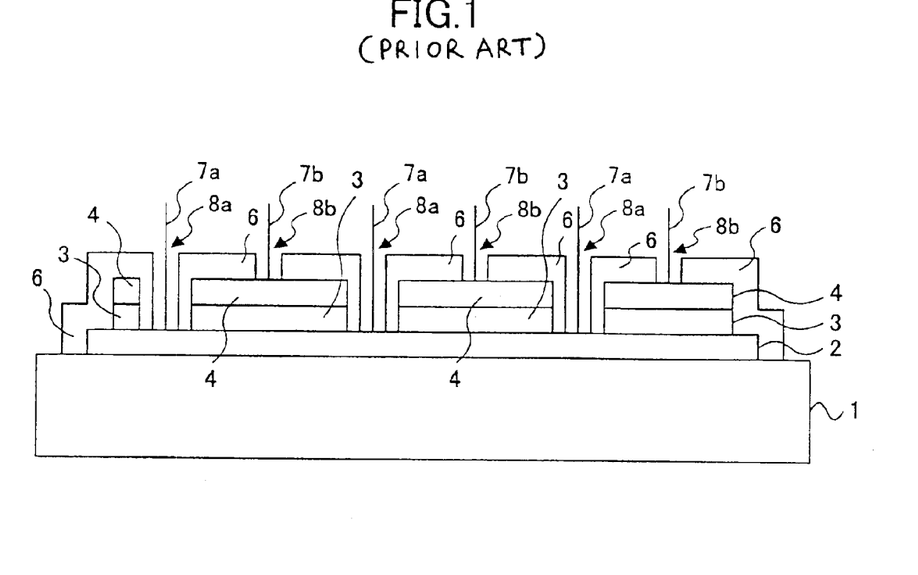
FIG. 1 is a cross-sectional view for explaining a substrate-embedded capacitor of the related art.

FIG. 1 is a cross-sectional view of a substrate-embedded capacitor of the related art.

The capacitor shown in FIG. 1 is comprised of a substrate 1, a lower electrode 2, a dielectric layer 3, an upper electrode 4, an insulating layer 6, and leader lines 7a and 7b.

The lower electrode 2, the upper electrode 4, and the dielectric layer 3 sandwiched by the lower electrode 2 and the upper electrode 4 form a capacitor, which possesses an electrical capacitance between the leader lines 7a and 7b.

FIGS. 2A through 2G are cross-sectional views showing a method for fabricating the substrate-embedded capacitor of the related art.

Next, the method for fabricating the substrate-embedded capacitor is explained with reference to FIGS. 2A through 2G.

Figure 2A:
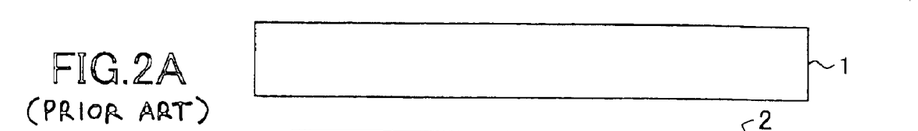
FIGS. 2A through 2G are cross-sectional views for explaining a method for fabricating the substrate-embedded capacitor of the related art.

First, as shown in FIG. 2A, a silicon wafer is prepared to be used as the substrate 1, on which a number of capacitors are to be fabricated.

Figure 2B:
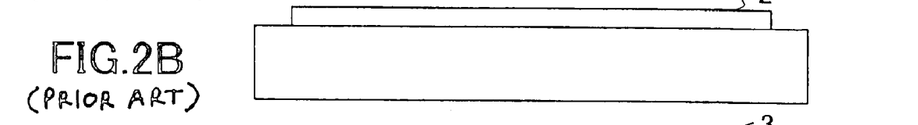

Next, as shown in FIG. 2B, the lower electrode 2 is formed for each capacitor to be fabricated on the upper surface of the silicon wafer 1. The lower electrode 2 can be formed, for example, by sputtering platinum (Pt).

Figure 2C:
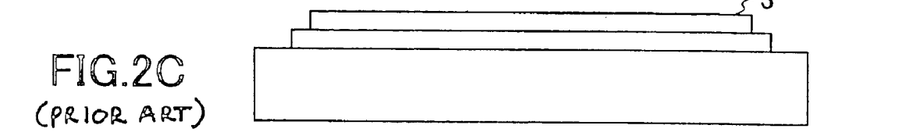

Next, as shown in FIG. 2C, the dielectric layer 3 (from a ferroelectric material) is formed on the lower electrode 2. The dielectric layer 3 can be formed, for example, by sputtering BST (Barium Strontium Titanate).

Figure 2D:
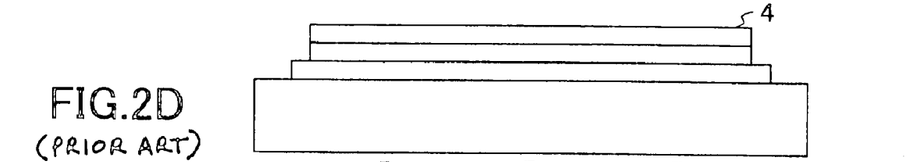

Next, as shown in FIG. 2D, the upper electrode 4 is formed on the dielectric layer 3. The upper electrode 4 can be formed, for example, by sputtering platinum. The lower electrode 2, the upper electrode 4, and the dielectric layer 3 sandwiched by the lower electrode 2 and the upper electrode 4 form a capacitor.

Figure 2E:
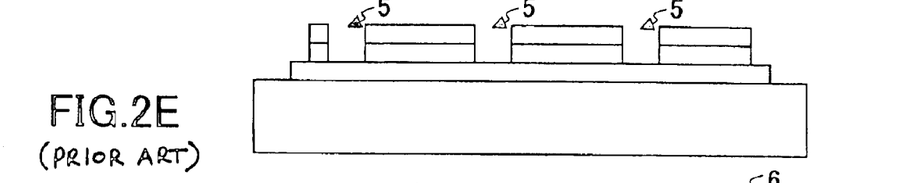

Next, as shown in FIG. 2E, openings 5 are formed in the upper electrode 4 and the dielectric layer 3 to expose the lower electrode 2. The openings 5 can be formed, for example, by dry etching or by laser irradiation.

Figure 2F:
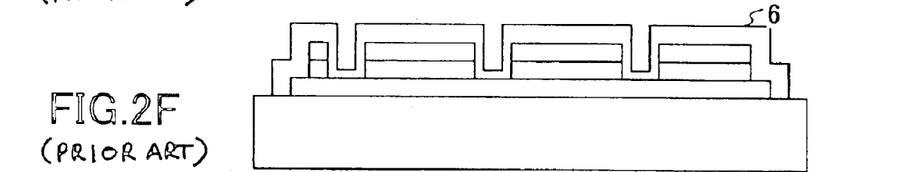

Next, as shown in FIG. 2F, the insulating layer 6 is formed to cover the upper surface of the upper electrode 4 and the side surfaces and bottoms of the openings 5. The insulating layer 6 can be formed, for example, by sputtering silicon nitride (SiN).

Figure 2G:
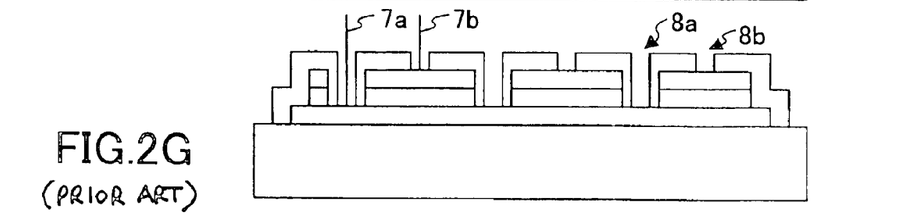

Next, as shown in FIG. 2G, openings 8a are formed in the insulating layer 6 to expose the lower electrode 2, and openings 8b are formed in the insulating layer 6 to expose the upper electrode 4. The openings 8a and 8b can be formed, for example, by dry etching or by laser irradiation. Through the openings 8a and 8b, the leader lines 7a and 7b are connected with the lower electrode 2 and the upper electrode 4, respectively.

Turning to the problem to be solved by the present invention, in the above substrate-embedded capacitor of the related art, the leader lines 7a and 7b of the lower electrode 2 and the upper electrode 4 are connected to the upper side of the substrate 1. This connection requires more space; in addition, there is no other choice for signal line connection; furthermore, the leader lines 7a and 7b themselves become long.

Further, in the above substrate-embedded capacitor of the related art, the semiconductor substrate 1 is thick, so the substrate-embedded capacitor as a whole becomes thick, and consequently, it is difficult to embed the capacitor in a circuit formed in the substrate.

SUMMARY OF THE INVENTION

Accordingly, it is a general object of the present invention to solve the above problem of the related art.

A more specific object of the present invention is to provide a capacitor embedded in a substrate having a small thickness and requiring only small space for short connection lines, a method for producing the capacitor, and a circuit board including the capacitor.

To attain the above object, according to a first aspect of the present invention, there is provided a capacitor comprising a substrate having an opening, a first conductive layer on the substrate, a dielectric layer on the first conductive layer, a second conductive layer on the dielectric layer, and an insulating layer formed on the second conductive layer and having an opening, wherein the first conductive layer and the second conductive layer are exposed through the openings in the substrate and the insulating layer, respectively.

According to the above aspect of the present invention, openings are formed in the substrate and insulating layer, respectively. Through the openings in the insulating layer, the upper electrode (the second conductive layer) of the capacitor can be connected with other circuits by a connection line, such as a leader line; through the openings in the substrate, the lower electrode (the first conductive layer) of the capacitor can be connected with other circuits by a connection line, such as a leader line.

Since openings are formed in the substrate, the substrate needs to be made thin, thereby reducing the thickness of the substrate.

Since openings are formed in the substrate, leader lines can be connected to the lower electrode (the first conductive layer) through the openings from the back surface of the substrate, thereby reducing the space required by the leader lines. Furthermore, because the capacitor becomes compact, the leader lines become short.

To attain the above object, according to a second aspect of the present invention, there is provided a capacitor comprising a substrate having an opening, a conductive member that fills the opening in the substrate, a first conductive layer formed on the substrate and the conductive member and electrically connected to the conductive member, a dielectric layer on the first conductive layer, a second conductive layer on the dielectric layer, and an insulating layer formed on the second conductive layer and having an opening, wherein the first conductive layer connected to the conductive member is exposed through the opening in the substrate, and the second conductive layer is exposed through the opening in the insulating layer.

According to the above aspect, openings are formed in the substrate and insulating layer, and through the openings in the insulating layer, leader lines can be connected to the upper electrode (the second conductive layer) of the capacitor; through the openings in the substrate, leader lines can be connected to the lower electrode (the first conductive layer) of the capacitor via the conductive member formed in the substrate.

Since openings are formed in the substrate, the substrate needs to be made thin, thereby reducing the thickness of the substrate.

Since openings are formed in the substrate, leader lines can be connected to the lower electrode (the first conductive layer) through the openings from the back surface of the substrate, thereby reducing the space required by the leader lines. Furthermore, because the capacitor becomes compact, the leader lines become short.

To attain the above object, according to a third aspect of the present invention, there is provided a method for producing a capacitor, comprising the steps of forming a first conductive layer, a dielectric layer, and a second conductive layer in sequence on a front surface of a substrate, forming an insulating layer on the second conductive layer, forming an opening in the insulating layer to expose the second conductive layer, reducing the thickness of the substrate, and forming an opening in the back surface of the substrate to expose the first conductive layer.

According to the above aspects, the substrate-embedded capacitor of the present invention can be fabricated appropriately.

To attain the above object, according to a fourth aspect of the present invention, there is provided a method for producing a capacitor, comprising the steps of forming a depressed portion on a front surface of a substrate, filling the depressed portion with a conductive material, forming a first conductive layer on the substrate while covering the depressed portion, forming a dielectric layer on the first conductive layer, forming a second conductive layer, forming an insulating layer on the second conductive layer, forming an opening in the insulating layer to expose the second conductive layer, and reducing the thickness of the substrate from the back surface of the substrate until the conductive material filling the depressed portion is exposed.

According to the above aspect, the substrate-embedded capacitor of the present invention can be fabricated appropriately.

To attain the above object, according to a fifth aspect of the present invention, there is provided a circuit board comprising a first interconnection layer, a second interconnection layer, and a capacitor between the first interconnection layer and the second interconnection layer, wherein the capacitor includes a substrate having an opening, a first conductive layer on the substrate, a dielectric layer on the first conductive layer, a second conductive layer on the dielectric layer, and an insulating layer formed on the second conductive layer and having an opening, the first conductive layer is connected with the first interconnection layer through the opening in the substrate, and the second conductive layer is connected with the second interconnection layer through the opening in the insulating layer.

According to the above aspect, it is possible to provide a circuit board in which is embedded a capacitor of short connection lines and capable of high speed operation.

These and other objects, features, and advantages of the present invention will become more apparent from the following detailed description of the preferred embodiments given with reference to the accompanying drawings.

DESCRIPTION OF THE PREFERRED EMBODIMENTS

Below, preferred embodiments of the present invention are explained with reference to the accompanying drawings.

First Embodiment

The first embodiment of the present invention is explained below with reference to FIG. 3.

Figure 3:
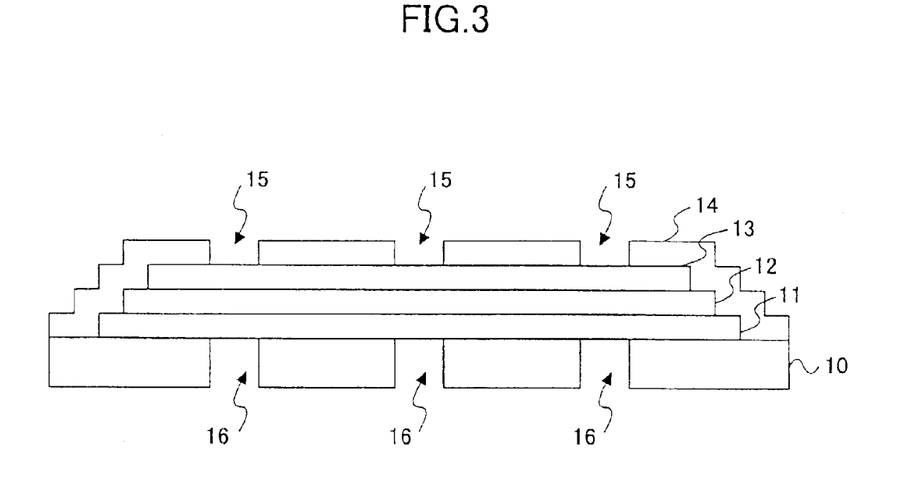
FIG. 3 is a cross-sectional view showing a substrate-embedded capacitor according to a first embodiment of the present invention.

FIG. 3 is a cross-sectional view showing a substrate-embedded capacitor according to the first embodiment of the present invention.

The capacitor shown in FIG. 3 is comprised of a substrate 10, a lower electrode 11, a dielectric layer 12, an upper electrode 13, and an insulating layer 14. The lower electrode 11, the upper electrode 13, and the dielectric layer 12 sandwiched by the lower electrode 11 and the upper electrode 13 form a capacitor. The dielectric layer 12 can be formed from barium titanate, strontium titanate, or tantalum oxide, for example.

In the capacitor shown in FIG. 3, openings 15 are formed in the insulating layer 14, and openings 16 are formed in the substrate 10. The upper electrode 13 is connected with circuits on the outside by leader lines (not-shown) through the openings 15 in the insulating layer 14, and the lower electrode 11 is connected with circuits on the outside by leader lines (not-shown) through the openings 16 in the substrate 10. That is, connection of the upper electrode 13 is made only on the upper side of the capacitor, and connection of the lower electrode 11 is made only on the lower side of the capacitor. Compared with the configuration of the related art, in which connection of the upper electrode and the lower electrode are both made on the upper side, the space required for allocating leader lines is reduced, and furthermore the leader lines become short.

Next, an explanation is made of the method for fabricating the substrate-embedded capacitor according to the present embodiment with reference to FIGS. 4A through 4F.

FIGS. 4A through 4F are cross-sectional views showing a method for fabricating the substrate-embedded capacitor according to the present embodiment.

Figure 4A:
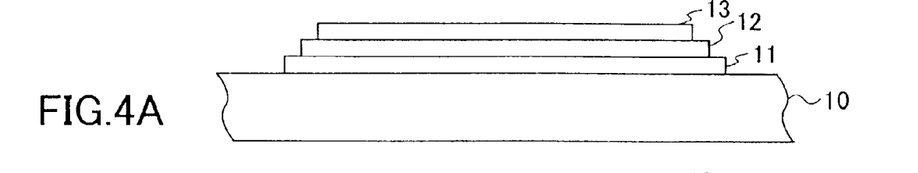
FIGS. 4A through 4F are cross-sectional views showing a method for fabricating the substrate-embedded capacitor according to the first embodiment of the present invention.

Step 1:

As shown in FIG. 4A, a silicon wafer is prepared to be used as the substrate 10, on which a number of capacitors are to be fabricated.

On the silicon wafer 10, the lower electrode 11, the dielectric layer 12 (from a ferroelectric material), and the upper electrode 13 are formed in sequence for each capacitor to be fabricated on the upper surface of the silicon wafer 10. The lower electrode 11, the upper electrode 13, and the dielectric layer 12 sandwiched by the lower electrode 11 and the upper electrode 13 form a capacitor.

In the above step shown in FIG. 4A, before forming the lower electrode 11 on the silicon wafer 10, the surface of the silicon wafer 10 may be roughened by plasma etching, etching using potassium hydroixide or other strong alkalis, or sandblasting. Forming the lower electrode 11, the dielectric layer 12, and the upper electrode 13 after the surface of the silicon wafer 10 is roughened, the capacitance of the capacitor is increased because the surface area of the lower electrode 11 is increased due to roughening.

Instead of roughening the surface of the silicon wafer 10, the surface of the lower electrode 11 may be roughened, and this also increases the capacitance of the capacitor.

The lower electrode 11 and the upper electrode 13 can be formed, for example, by sputtering platinum (Pt). The dielectric layer 12 can be formed, for example, by sputtering BST (Barium Strontium Titanate).

In the above step shown in FIG. 4A, the upper electrode 13 is formed to be slightly smaller than the dielectric layer 12. This is for the purpose of preventing a short circuit between the upper electrode 13 and the lower electrode 11.

Figure 4B:
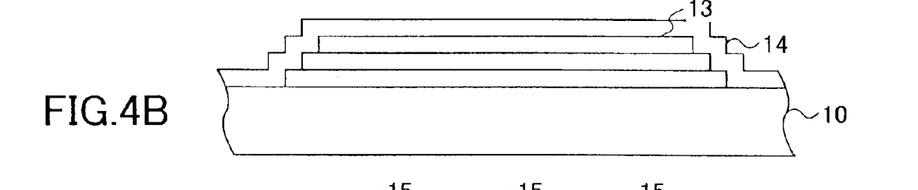

Step 2:

As shown in FIG. 4B, the insulating layer 14 is formed to cover the upper surface of the upper electrode 13 and the surface of the silicon wafer 10. The insulating layer 14 can be formed, for example, by sputtering silicon nitride (SiN).

Figure 4C:
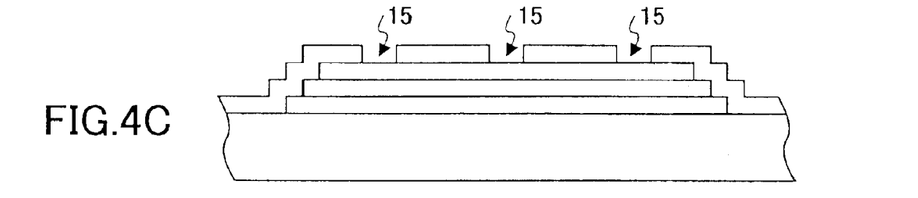

Step 3:

As shown in FIG. 4C, openings 15 are formed in the insulating layer 14 to expose the upper electrode 13. The openings 15 can be formed, for example, by dry etching or by laser irradiation.

Figure 4D:
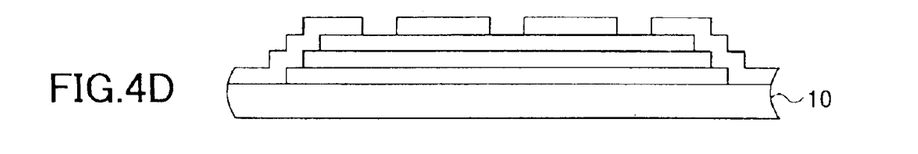

Step 4:

As shown in FIG. 4D, the silicon wafer 10 is made thin by grinding the back surface. For example, the thickness of the silicon wafer 10 is reduced from about 500 µm to about 50 µm by grinding.

Figure 4E:
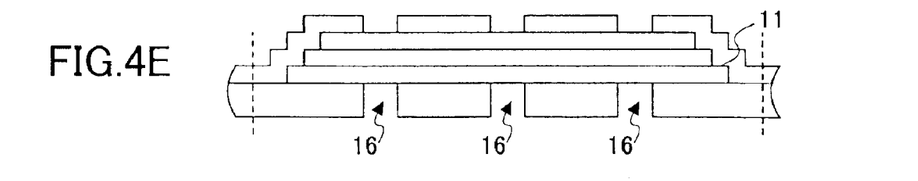

Step 5:

As shown in FIG. 4E, openings 16 are formed in the silicon wafer 10 from the back surface of the silicon wafer 10 to expose the lower electrode 11. The openings 16 can be formed, for example, by dry etching or by laser irradiation.

Figure 4F:
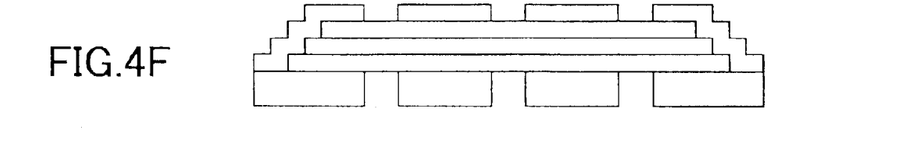

Step 6:

As shown in FIG. 4F, along the dotted lines in FIG. 4E, the silicon wafer 10 is cut into individual capacitors, which is the so-called "dicing process". This process may be performed by a common dicer, or by dry etching or laser irradiation because the silicon wafer 10 is now quite thin.

According to the present embodiment, the substrate (silicon wafer) 10 is made thin, and the space required by leader lines for connection to the capacitor is reduced. Consequently, the capacitor can be made compact with only short leader lines.

Because the leader lines can be shortened, the inductance caused by the length of the signal lines becomes small. As a result, a circuit formed with such a substrate-embedded capacitor can operate at high speed.

According to the present embodiment, the capacitor has a simple configuration.

According to the fabrication method of the present embodiment, the capacitor can be fabricated easily. In addition, many capacitors can be fabricated at the same time.

Second Embodiment

The second embodiment of the present invention is explained below with reference to FIG. 5.

Figure 5:
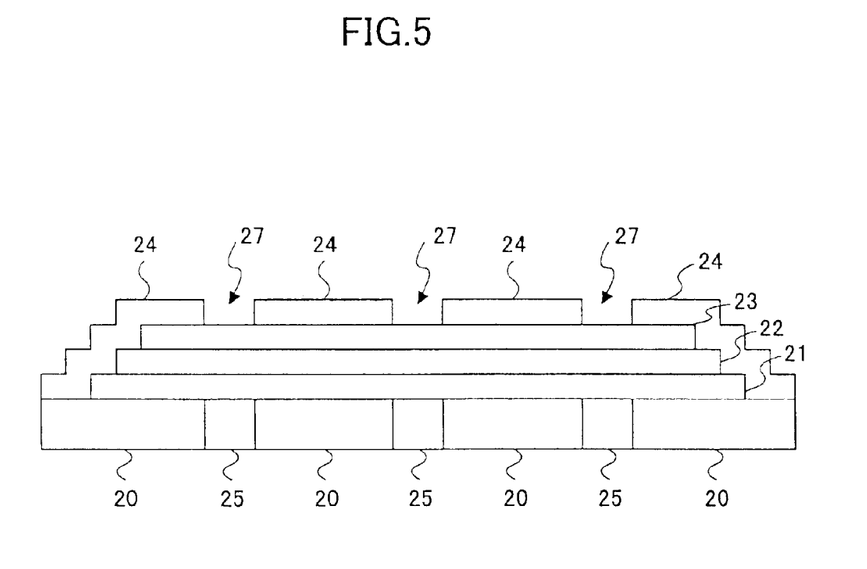
FIG. 5 is a cross-sectional view showing a substrate-embedded capacitor according to a second embodiment of the present invention.

FIG. 5 is a cross-sectional view showing a substrate-embedded capacitor according to the second embodiment of the present invention.

The capacitor shown in FIG. 5 is comprised of a substrate 20, a lower electrode 21, a dielectric layer 22, an upper electrode 23, an insulating layer 24, and connecting members 25. The lower electrode 21, the upper electrode 23, and the dielectric layer 22 sandwiched by the lower electrode 21 and the upper electrode 23 form a capacitor. The dielectric layer 22 can be formed from barium titanate, strontium titanate, or tantalum oxide, for example. Openings 27 are formed in the insulating layer 24.

In the capacitor shown in FIG. 5, the upper electrode 23 is connected to circuits on the outside by leader lines (not-shown) through the openings 27 in the insulating layer 24, and the lower electrode 21 is connected to circuits on the outside by the connecting members 25 in the substrate 20. That is, connection to the upper electrode 23 is made only on the upper side of the capacitor, and connection of the lower electrode 21 is made only on the lower side of the capacitor. Compared with the configuration of the related art, in which connection of the upper electrode and the lower electrode are both made on the upper side, the space required for allocating leader lines is reduced, furthermore the leader lines become short.

Next, an explanation is made of the method for fabricating the substrate-embedded capacitor according to the present embodiment with reference to FIGS. 6A through 6F.

FIGS. 6A through 6F are cross-sectional views showing a method for fabricating the substrate-embedded capacitor according to the second embodiment of the present invention.

Figure 6A:
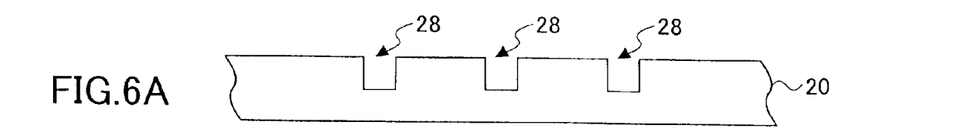
FIGS. 6A through 6F are cross-sectional views showing a method for fabricating the substrate-embedded capacitor according to the second embodiment of the present invention.

Step 1:

As shown in FIG. 6A, a silicon wafer is prepared to be used as the substrate 20, on which a number of capacitors are to be fabricated. On the upper surface of the silicon wafer 20, on which the lower electrode 21 is to be formed, recesses 28 are formed in areas designated to be connected to the lower electrode 21.

The recesses 28 can be formed, for example, by dry etching or by laser irradiation.

Figure 6B:
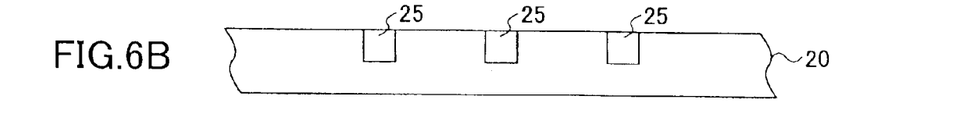

Step 2:

As shown in FIG. 6B, the recesses 28 on the surface of the silicon wafer 20 are filled with a conductive material to form the connecting members 25. For example, one of copper, nickel and other metals is used as the conductive material comprising the connecting members 25. The recesses 28 may be filled with the conductive material by plating, for example. In the plating process, for example, electroless plating and electro-plating may be preformed sequentially.

Figure 6C:
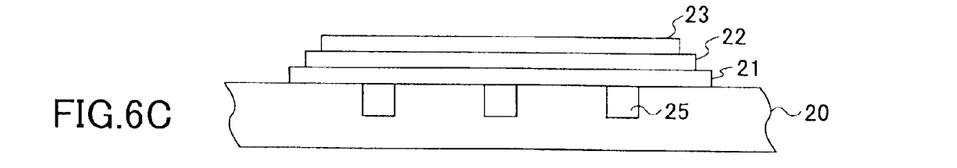

Step 3:

As shown in FIG. 6C, on the upper surface of the silicon wafer 20, on which recesses 28 are formed and filled with a conductive material, the lower electrode 21, the dielectric layer 22 (from a ferroelectric material), and the upper electrode 23 are formed in sequence for each capacitor to be fabricated on the upper surface of the silicon wafer 20. The lower electrode 21, the upper electrode 23, and the dielectric layer 22 sandwiched by the lower electrode 21 and the upper electrode 23 form a capacitor. Before forming the lower electrode 21 on the silicon wafer 20, as described in the first embodiment, the surface of the silicon wafer 20 may be roughened by plasma etching, etching using potassium hydroixide or other strong alkalis, or sandblasting, and this increases the capacitance of the capacitor.

The lower electrode 21 and the upper electrode 23 can be formed, for example, by sputtering platinum (Pt). The dielectric layer 22 can be formed, for example, by sputtering BST (Barium Strontium Titanate).

The upper electrode 23 is formed to be slightly smaller than the dielectric layer 22. This prevents a short circuit between the upper electrode 23 and the lower electrode 21.

Figure 6D:
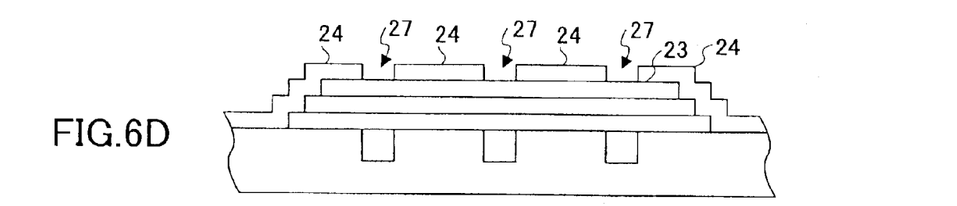

Step 4:

As shown in FIG. 6D, the insulating layer 24 is formed to cover the upper surface of the upper electrode 23 and the surface of the silicon wafer 20. The insulating layer 24 can be formed, for example, by sputtering silicon nitride (SiN).

In the insulating layer 24, openings 27 are formed to expose the upper electrode 23. The openings 27 can be formed, for example, by dry etching or by laser irradiation.

Figure 6E:
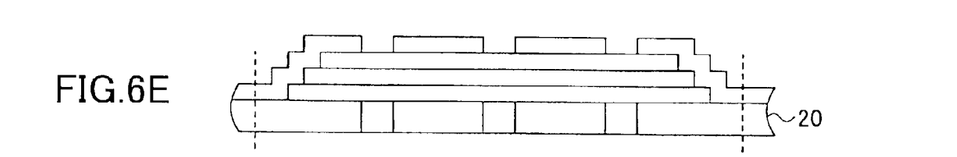

Step 5:

As shown in FIG. 6E, the silicon wafer 20 is made thin by grinding the back surface. For example, the thickness of the silicon wafer 20 is reduced from about 500 $\mu$m to about 50 $\mu$m by grinding.

Due to this grinding, the conductive material filling the recesses 28 is exposed at the back surface of the silicon wafer 20, forming the connecting members 25 that connect the lower electrode 21 to circuits on the outside.

Figure 6F:
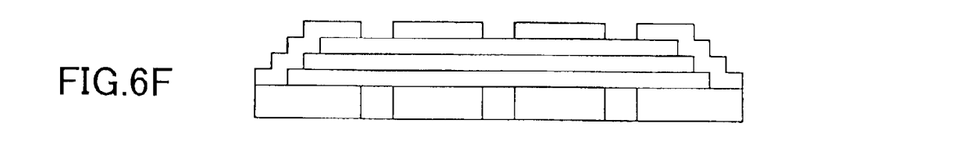

Step 6:

As shown in FIG. 6F, along the dotted lines illustrated in FIG. 6E, the silicon wafer 20 is cut into individual capacitors; this is the so-called "dicing process". This process may be performed by a common dicer, or by dry etching or laser irradiation, for example, because the silicon wafer 20 is now quite thin.

In the above, although it is described that different materials are used for the conductive material filling the recesses 28 and the lower electrode 21, they can also be formed from the same conductive material, for example, the same metal. By using the same conductive material, the processes of filling the recesses 28 with the conductive material and forming the lower electrode 21 become easy.

According to the present embodiment, the substrate (silicon wafer) 20 is made thin, and the space required by leader lines for connection to the capacitor is reduced; consequently, the capacitor can be made compact with only short leader lines.

Because the leader lines are short, the inductance caused by the length of the signal lines becomes small. As a result, a circuit formed with such a substrate-embedded capacitor can operate at high speed.

According to the fabrication method of the present embodiment, the process of reducing the thickness of the silicon wafer 20 is performed after formation of the capacitor. Therefore, only the dicing process is performed on the reduced-thickness silicon wafer 20, so compared with the first embodiment, handling of the reduced-thickness silicon wafer 20 become easy. In addition, many capacitors can be fabricated at the same time.

Third Embodiment

The third embodiment of the present invention is explained below with reference to FIG. 7.

Figure 7:
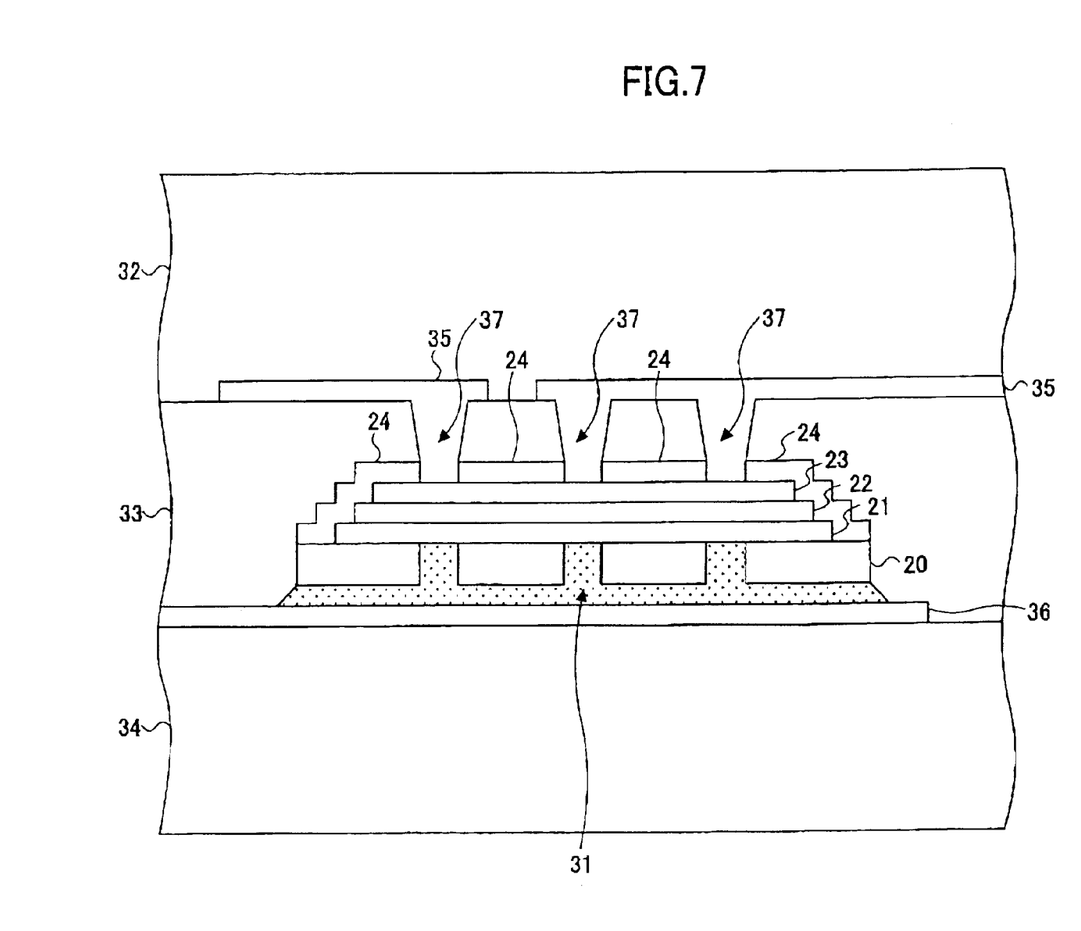
FIG. 7 is a cross-sectional view showing a circuit with a substrate-embedded capacitor according to a third embodiment of the present invention.

FIG. 7 is a cross-sectional view showing a circuit board according to the third embodiment of the present invention, with a capacitor embedded as described in the first and the second embodiments.

Note that the same reference numerals are used below for the same elements as in the second embodiment.

The circuit board shown in FIG. 7 is comprised of a substrate 20 with a capacitor embedded, a lower electrode 21, a dielectric layer 22, an upper electrode 23, an insulating layer 24, conductive resin 31 functioning as a conductive adhesive agent, insulating layers 32, 33, and 34, and interconnection patterns 35 and 36. Instead of by the conductive resin 31 (conductive adhesive agent), the substrate 20 and the interconnection pattern 36 may be connected by soldering.

In the circuit board shown in FIG. 7, the lower electrode 21 is connected to the interconnection pattern 36 by the conductive resin 31, and the upper electrode 23 is connected to the interconnection patterns 35 though via-holes 37 formed in the insulating layer 33. The lower electrode 21, the upper electrode 23, and the dielectric layer 22 sandwiched by the lower electrode 21 and the upper electrode 23 form a capacitor.

While the present invention has been described with reference to specific embodiments chosen for purpose of illustration, it should be apparent that the invention is not limited to these embodiments, but numerous modifications could be made thereto by those skilled in the art without departing from the basic concept and scope of the invention.

Summarizing the effect of the invention, the substrate can be made thin, and the space required for connection to the capacitor is reduced; consequently, the capacitor can be made compact with only short connection signal lines.

This patent application is based on Japanese priority patent application No. 2002-161842 filed on Jun. 3, 2002, the entire contents of which are hereby incorporated by reference.

What is claimed is:

1. A capacitor, comprising:
    a silicon substrate with an opening formed therein and having a thickness less than a predetermined value;
    a first conductive layer on the substrate;
    a dielectric layer on the first conductive layer;
    a second conductive layer on the dielectric layer; and
    an insulating layer on the second conductive layer and in contact with the dielectric layer, the first conductive layer, and the silicon substrate to cover the second conductive layer, the dielectric layer, the first conductive layer, and the silicon substrate, the insulating layer having an opening formed therein,
    wherein the first conductive layer and the second conductive layer are exposed through the openings in the substrate and the insulating layer, respectively.

2. The capacitor as claimed in claim 1, wherein the thickness of the silicon substrate is ground to be about 50 $\mu$m.

3. The capacitor as claimed in claim 1, wherein the silicon substrate has a roughened surface on which the first conductive layer is formed.

4. The capacitor as claimed in claim 1, wherein the first conductive layer has a roughened surface on which the dielectric layer is formed.

5. The capacitor as claimed in claim 1, wherein an area of the second conductive layer is less than an area of the dielectric layer, and the area of the dielectric layer is less than an area of the first conductive layer.

6. The capacitor as claimed in claim 1, wherein the first conductive layer, the dielectric layer, and the second conductive layer are thin films formed by sputtering.

7. A capacitor, comprising:
a silicon substrate with an opening formed therein and having a thickness less than a predetermined value;
a conductive member that fills the opening in the substrate;
a first conductive layer formed on the silicon substrate and electrically connected to the conductive member;
a dielectric layer on the first conductive layer;
a second conductive layer on the dielectric layer; and
an insulating layer on the second conductive layer and in contact with the dielectric layer, the first conductive layer, and the silicon substrate to cover the second conductive layer, the dielectric layer, the first conductive layer, and the silicon substrate, the insulating layer having an opening formed therein,
wherein the conductive member connected to the first conductive layer is exposed through the opening in the substrate; and the second conductive layer is exposed through the opening in the insulating layer.

8. The capacitor as claimed in claim 7, wherein the thickness of the silicon substrate is ground to be about 50 μm.

9. The capacitor as claimed in claim 7, wherein the silicon substrate has a roughened surface on which the first conductive layer is formed.

10. The capacitor as claimed in claim 7, wherein the first conductive layer has a roughened surface on which the dielectric layer is formed.

11. The capacitor as claimed in claim 7, wherein
an area of the second conductive layer is less than an area of the dielectric layer, and
the area of the dielectric layer is less than an area of the first conductive layer.

12. The capacitor as claimed in claim 7, wherein the first conductive layer, the dielectric layer, and the second conductive layer are thin films formed by sputtering.

13. A circuit board with a capacitor embedded therein, comprising:
a first interconnection layer;
a second interconnection layer; and
a capacitor between the first interconnection layer and the second interconnection layer,
wherein the capacitor includes
a silicon substrate with an opening formed therein and having a thickness less then a predetermined value,
a first conductive layer on the substrate,
a dielectric layer on the first conductive layer,
a second conductive layer on the dielectric layer, and
an insulating layer on the second conductive layer and in contact with the dielectric layer, the first conductive layer, and the silicon substrate to cover the second conductive layer, the dielectric layer, the first conductive layer, and the silicon substrate, the insulating layer having an opening therein,
the first conductive layer is connected to the first interconnection layer through the opening in the substrate, and
the second conductive layer is connected to the second interconnection layer through the opening in the insulating layer.

* * * * *